(12) United States Patent
Yu et al.

(10) Patent No.: US 6,528,858 B1
(45) Date of Patent: Mar. 4, 2003

(54) MOSFETS WITH DIFFERING GATE DIELECTRICS AND METHOD OF FORMATION

(75) Inventors: Bin Yu, Cupertino, CA (US); Qi Xiang, San Jose, CA (US); Olov Karlsson, San Jose, CA (US); HaiHong Wang, Fremont, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/044,892

(22) Filed: Jan. 11, 2002

(51) Int. Cl.[7] .............................................. H01L 29/02
(52) U.S. Cl. .................... 257/493; 257/497; 257/506; 257/511; 257/521
(58) Field of Search ................................ 257/493, 497, 257/506, 511, 521

(56) References Cited

U.S. PATENT DOCUMENTS

| 6,013,553 A | 1/2000 | Wallace et al. |
| 6,020,024 A | 2/2000 | Maiti et al. |
| 6,048,769 A * | 4/2000 | Chau ............................ 257/511 |

* cited by examiner

*Primary Examiner*—Edward Wojciechowicz
(74) *Attorney, Agent, or Firm*—Renner, Otto, Boisselle & Sklar, LLP

(57) ABSTRACT

A semiconductor wafer including an NMOS device and a PMOS device. The NMOS device is formed to have a high-K gate dielectric and the PMOS device is formed to have a standard-K gate dielectric. A method of forming the NMOS device and the PMOS device is also disclosed.

31 Claims, 3 Drawing Sheets

MOSFETS WITH DIFFERING GATE DIELECTRICS AND METHOD OF FORMATION

TECHNICAL FIELD

The present invention relates generally to semiconductor devices and the fabrication thereof and, more particularly, to a first and a second MOSFET having differing dielectrics a method of formation.

BACKGROUND

A pervasive trend in modern integrated circuit manufacture is to produce semiconductor devices, such as metal oxide semiconductor field effect transistors MOSFETs), that are as small as possible. In a typical MOSFET, a source and a rain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. For example, certain materials, when used in a down-scaled device, may become electrically leaky and can cause reliability problems. In addition, the fabrication of downscaled devices should be kept within a thermal budget so as to minimize the introduction of device irregularities.

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the invention, a semiconductor wafer including an NMOS device and a PMOS device. The NMOS device includes a first source, a first drain and a first body formed from a layer of semiconductor material, the first body disposed between the first source and the first drain. The NMOS device also includes a first gate formed over the first body and having a first gate electrode defining a first channel interposed between the first source and the first drain, the first gate electrode separated from the layer of semiconductor material by a high-K gate dielectric. The PMOS device includes a second source, a second drain and a second body formed from the layer of semiconductor material, the second body disposed between the second source and the second drain. The PMOS device also includes a second gate formed over the second body and having a second gate electrode defining a second channel interposed between the second source and the second drain, the second gate electrode separated from the layer of semiconductor material by a standard-K gate dielectric.

According to another aspect of the invention, a method of forming an NMOS device and a PMOS device on a semiconductor wafer. The method includes providing a layer of semiconductor material, forming the NMOS device and forming the PMOS device following NMOS device formation. Forming the NMOS device includes forming a layer of high-K dielectric material over the layer of semiconductor material; forming a first gate electrode for the NMOS device; and forming a first source and a first drain for the NMOS device from the layer of semiconductor material such that the first gate electrode defines a first channel interposed between the first source and the first drain. Forming the PMOS device includes encapsulating the NMOS device with a protective layer; forming a layer of standard-K dielectric material over the layer of semiconductor material; forming a second gate electrode for the PMOS device; and forming a second source and a second drain for the PMOS device from the layer of semiconductor material such that the second gate electrode defines a second channel interposed between the second source and the second drain.

BRIEF DESCRIPTION OF DRAWINGS

These and further features of the present invention will be apparent with reference to the following description and drawings, wherein.

DISCLOSURE OF INVENTION

Figure 1:
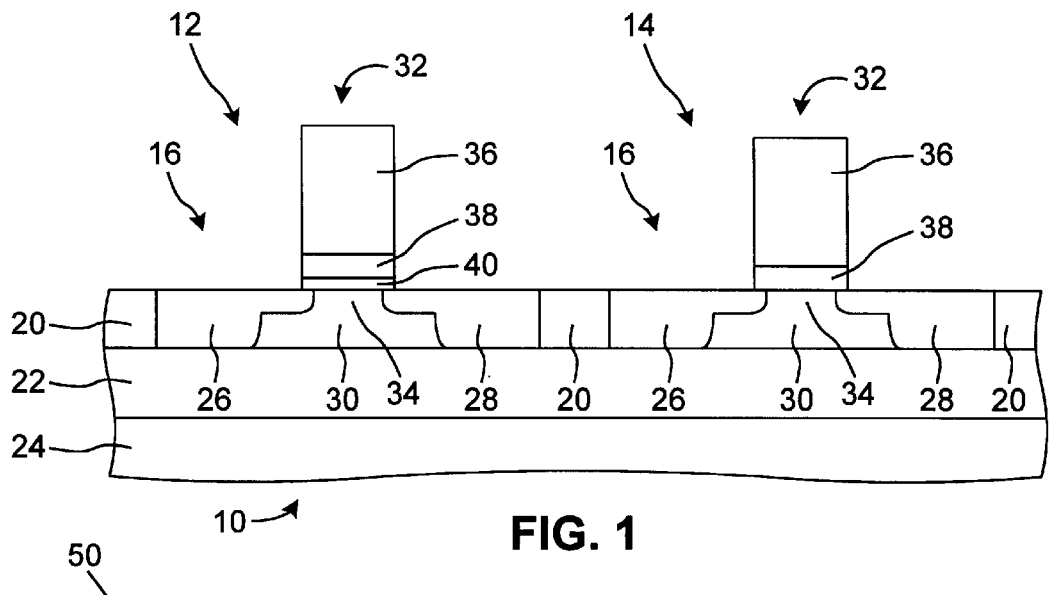
FIG. 1 is a schematic block diagram of a wafer having two exemplary semiconductor devices formed in accordance with an aspect of the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a wafer 10 having a first semiconductor device and a second semiconductor device formed in accordance with an example embodiment of the present invention is illustrated. The illustrated semiconductor devices are MOSFETs used, for example, in the construction of a complimentary metal oxide semiconductor (CMOS) integrated circuit. As one skilled in the art will appreciate, the structures and the techniques for fabricating the semiconductor devices described herein can be used for other types of devices (e.g., other types of transistors, memory cells, etc.) and the illustrated MOSFETs are merely exemplary. However, to clearly and concisely set for the present invention, one of the exemplary semiconductor devices is illustrated as an NMOS device and will be referred to herein as NMOS device 12. Similarly, the second exemplary semiconductor device is illustrated as a PMOS device and will be referred to herein as PMOS device 14. Although only one NMOS device 12 and one PMOS device 14 is illustrated, one skilled in the art will appreciate that the illustrated devices are merely exemplary and that multiple NMOS devices 12 and/or PMOS devices 14 can be formed on the wafer 10.

Each of the NMOS device 12 and the PMOS device 14 is formed using an active region 16 formed in a layer of semiconductor material 18 (FIG. 3A) and defined by isolation regions 20. As illustrated, the layer of semiconductor material 18 can be a semiconductor film (for example, comprised of silicon, silicon-germanium, or the like) formed on a layer of insulating material 22 (for example, a buried oxide (BOX) layer). The insulating layer 22 is, in turn, formed on a semiconductor substrate 24 so that the resultant devices (e.g., NMOS device 12 and PMOS device 14) are formed in semiconductor-on-insulator (SOI) format. Alternatively, the layer of semiconductor material 18 can be a semiconductor substrate for the formation of bulk devices.

The active region 16 for each of the NMOS device 12 and the PMOS device 14 includes a source 26, a drain 28 and a body 30 disposed between the source 26 and the drain 28. As is well known in the art, the source 26 and the drain 28 can include respective extension regions and deep doped regions.

A gate 32 is disposed on the layer of semiconductor material 18 over the body 30 and defines a channel 34 within the body 30 (the channel 34 being interposed between the source 26 and the drain 28 and controlled by a work function of the gate 32). The gate 32 includes a gate electrode 36 spaced from the layer of semiconductor material 18 by a gate dielectric 38. In one embodiment, the gate electrode 36 is made form a semiconductor material (e.g., polycrystalline silicon, polycrystalline silicon-germanium, etc.) that is doped with an appropriate dopant. In alternative embodiments, the gate could be made form a metal or metal containing compound such as, for example, tungsten, tantalum, aluminum, nickel, ruthenium, rhodium, palladium, platinum, titanium, molybdenum, titanium-nitride, tantalum nitride, or the like.

In one embodiment, the gate dielectric 38 for the NMOS device 12 is made from a high-K material or stack of materials to form a high-K dielectric stack. As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_0$) that is K=$\epsilon/\epsilon_0$. High-K materials will be described in greater detail below. Although other materials can be selected for the gate dielectric 38 of the NMOS device 12, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials for the gate dielectric 38 of the NMOS device 12. In addition, all binary and ternary metal oxides and ferroelectric materials having a K higher than, in one embodiment, about twenty (20) can be used for the gate dielectric 38 of the NMOS device 12.

As used herein, the term "standard-K dielectric material" or "standard-K dielectric material" refers to a dielectric material having a relative permittivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the gate dielectric 38, the high-K material can have an equivalent oxide thickness (EOT) of about one nanometer (1 nm) or less. A relatively small EOT is desirable to enhance switching speed of the NMOS device 12 (N-channel MOSFET speed being closely related to CMOS circuit performance). In the NMOS devices 12 described herein, a gate dielectric made from a high-K material may also be desirable to minimize performance degrading effects, such as leakage, that may occur when the thickness of a standard-K dielectric material becomes thin (e.g., approaching about 10 Å). A high-K dielectric allows for the establishment of a suitable capacitance with a physically thicker dielectric layer. For example, a nitride gate dielectric having a K of about 7.8 and a thickness of about 100 Å is substantially electrically equivalent to an oxide gate dielectric having a K of about 3.9 and a thickness of about 50 Å. In addition, devices fabricated with a high-K dielectric layer tend to have improved reliability.

When a high-K material is selected as the gate dielectric 38, a buffer interface 40 can be used between the layer of semiconductor material 18 and the gate dielectric 38. The buffer interface 40 can be, for example, an oxide layer having a thickness of about 0.5 nm to about 0.7 nm. The buffer interface 40 acts to reduce diffusion and/or penetration of atoms from the high-K dielectric material into the layer of semiconductor material 18 that could lead to a degradation in channel mobility. In addition, the buffer interface 40 may act to retard reaction of the high-K material with the layer of semiconductor material 18.

The gate dielectric 38 of the PMOS device 14 can be made from a standard-K material, such as, for example, a nitride (e.g., silicon nitride) or an oxynitride (e.g., silicon oxynitride).

Furthermore, and as will be described in greater detail below with respect to the method 50 (FIG. 2), the PMOS device 14 is formed with a relatively low thermal budget. In addition, since the PMOS device 14 is formed after the NMOS device 12 in method 50, the PMOS device 14 is formed with a lower thermal budget than the NMOS device 12. In P-channel MOSFETs, a low thermal budget may be desirable to reduce P-type dopant (such as boron) diffusion so as to control junction depth for enhanced short channel effect (SCE) control. As one skilled in the art will appreciate FET devices with a channel having a relatively short length can be susceptible to a number of undesirable electrical characteristics referred to as short channel effects. SCE generally can occur when a gate does not have adequate control over the channel region, and can include threshold voltage rolloff, off current rollup and drain induced barrier lowering. As the physical dimensions decrease, SCE can become more severe. SCE is the result of intrinsic properties of the crystalline material used in the FET devices. Namely, the band gap and built-in potential at the source/body and the drain/body junctions are non-scalable with the reduction of physical device dimensions, such as a reduction in channel length.

The NMOS device 12 and the PMOS device 14 each can optionally be provided with a gate electrode contact (not shown) used in establishing electrical connection to the gate electrodes 36. If desired, source 26 and drain 28 contacts (not shown) can also be provided. Other components, such as a cap (or passivation) layer (not shown), vias (not shown), conductor lines (not shown) and any other appropriate components to interconnect devices formed on the wafer 10, can also be provided.

Figure 2:
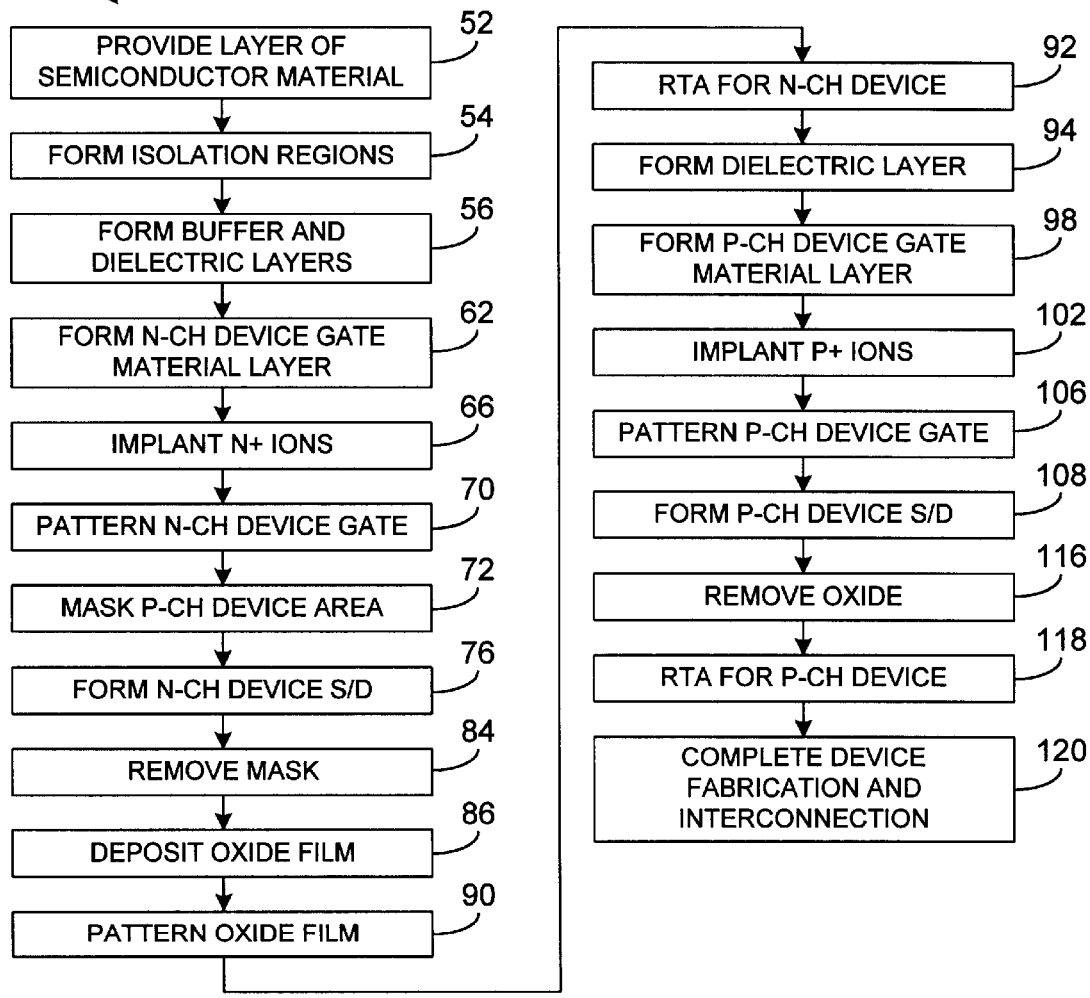
FIG. 2 is a flow chart illustrating a method of forming the wafer of FIG. 1.

Referring now to FIG. 2, an example method 50 for forming the semiconductor devices illustrated in FIG. 1 will be described. With additional reference to FIG. 3A, the method 50 starts in step 52 where the layer of semiconductor material 18 is provided. As indicated above, the layer of semiconductor material 18 can be a semiconductor film (such as a silicon film or a silicon-germanium film) formed as part of a SOI substrate stack. Alternatively, the layer of semiconductor material 18 can be a semiconductor substrate (such as a silicon substrate) for the formation of bulk-type devices. If appropriate, the layer of semiconductor material 18 can be doped with N-type and/or P-type dopant for use in the formation of N-type body regions 30 and/or P-type body regions 30 (including, for example, N-type and/or P-type wells for bulk-type devices).

Next, in step 54, the isolation regions 20 can be formed. The isolation regions 20 define the size and the placement of the active regions 16 (FIG. 1). The isolation regions 20 can be formed using a shallow trench isolation (STI) formation technique, as is conventional.

Next, in step 56, a buffer interface material layer 58 can be formed on the layer of semiconductor material 18. As indicated, the buffer interface material layer 58 can be a thin layer of oxide. For example, the buffer interface material layer 58 can be a layer of silicon oxide that is about 0.5 nm to about 0.7 nm thick. The buffer interface layer can be formed by a low temperature (about 500° C.) thermal oxidation process, a remote plasma deposition process, an atomic layer deposition (ALD) process or the like. The buffer interface material layer 58 assists in reducing integration issues that may arise when attempting form a layer of high-K material on a semiconductor layer. Therefore, if the gate dielectric is formed from a standard-K material or if the buffer interface 40 is not desired, the buffer interface material layer 58 can be omitted.

Also in step 56, a layer of dielectric material 60 is formed on the buffer interface material layer 58 (if the buffer interface material layer 58 is omitted, the layer of dielectric material 60 can be formed on the layer of semiconductor material 18 or other intermediate layer formed in place of the buffer interface material layer 58). The layer of dielectric material 60 can be formed from a high-K dielectric material or a stack of materials that, in combination, have high-K dielectric properties.

Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide (Al$_2$O$_3$) | 9–10 |
| zirconium silicate | 12 |
| hafnium silicate | 15 |
| hafnium silicon oxynitride | 16 |
| hafnium silicon nitride | 18 |
| lanthanum oxide (La$_2$O$_3$) | 20–30 |
| hafnium oxide (HfO$_2$) | 40 |
| zirconium oxide (ZrO$_2$) | 25 |
| cerium oxide (CeO$_2$) | 26 |
| bismuth silicon oxide (Bi$_4$Si$_2$O$_{12}$) | 35–75 |
| titanium dioxide (TiO$_2$) | 30 |
| tantalum oxide (Ta$_2$O$_5$) | 26 |
| tungsten oxide (WO$_3$) | 42 |
| yttrium oxide (Y$_2$O$_3$) | 20 |
| lanthanum aluminum oxide (LaAlO$_3$) | 25 |
| barium strontium titanate (Ba$_{1-x}$Sr$_x$TiO$_3$) | ~20–~200 |
| barium strontium oxide (Ba$_{1-x}$Sr$_x$O$_3$) | ~20–~200 |
| PbTiO$_3$ | ~20–~200 |
| barium titanate (BaTiO$_3$) | ~20–~200 |
| strontium titanate (SrTiO$_3$) | ~20–~200 |
| PbZrO$_3$ | ~20–~200 |
| PST (PbSc$_x$Ta$_{1-x}$O$_3$) | 3000 |
| PZN (PbZn$_x$Nb$_{1-x}$O$_3$) | ~500–~5000 |
| PZT (PbZr$_x$Ti$_{1-x}$O$_3$) | ~150–~1000 |
| PMN (PbMg$_x$Nb$_{1-x}$O$_3$) | ~500–~5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula Ta$_2$O$_5$, but may include variants of stoichiometric Ta$_2$O$_5$, which may be referred to as Ta$_x$O$_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula Ta$_2$O$_5$ is used, Ta$_x$O$_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 3A:
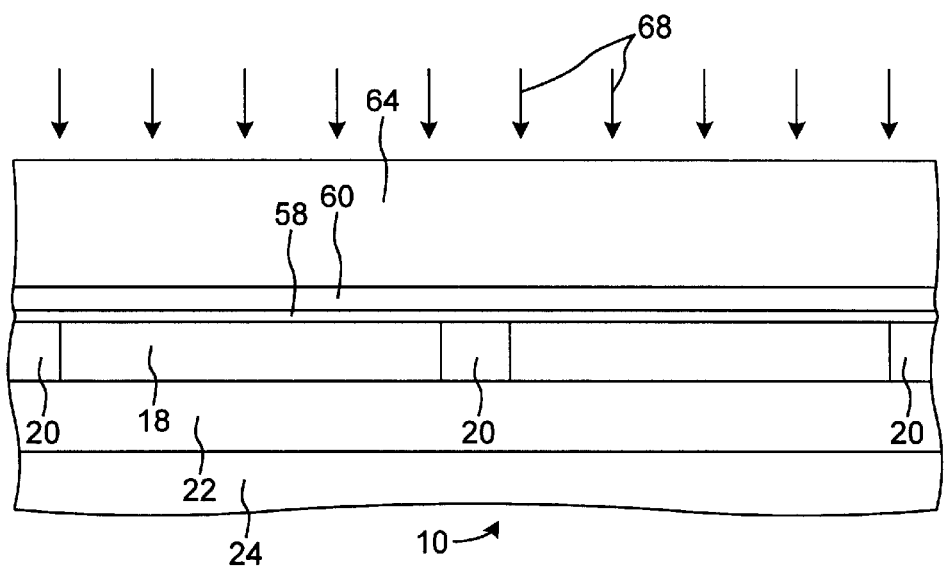
FIGS. 3A through 3E illustrate the wafer of FIG. 1 in various stages of manufacture.

With continued reference to FIGS. 2 and 3A, the method continues in step 62 where a first layer of gate electrode material 64 used to form the gate electrode 36 of the NMOS device 12 is formed on the layer of dielectric material 60. The layer of material 64 can be a semiconductor, such as polycrystalline silicon, polycrystalline silicon-germanium, or the like. In an alternative embodiment, the layer of material 64 can be a metal or metal containing compound such as tungsten, tantalum, aluminum, titanium nitride, tantalum nitride, etc.

Thereafter, in step 66, the layer of material 64 can be doped with N+ions 68, including for example, antimony, phosphorous or arsenic.

Figure 3B:
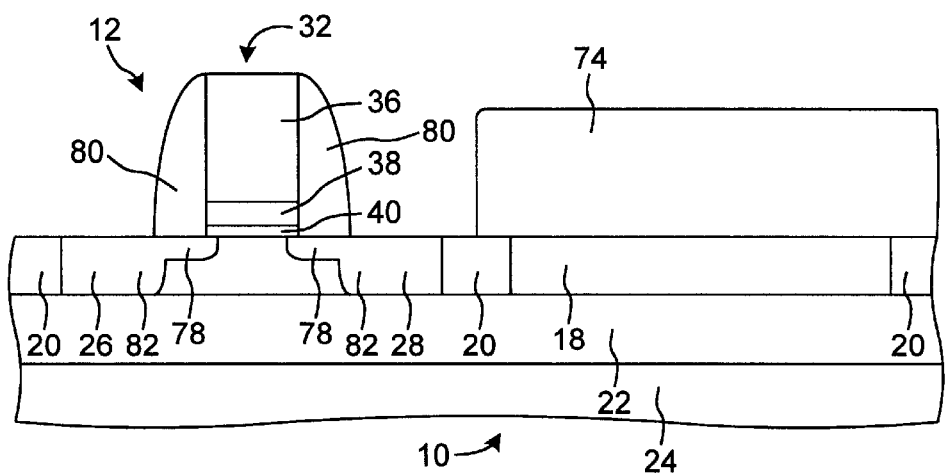

Thereafter, in step 70 and with additional reference to FIG. 3B, the layer of material 64 can be patterned to form the gate electrode 36 for the NMOS device 12. If desired, step 70 can include patterning of the layer of dielectric material 60 and/or buffer interface material layer 58, thereby exposing portions of the layer of semiconductor material 18 that extend laterally beyond the desired gate electrode 36. Alternatively, patterning of the layer of dielectric material 60 and/or a buffer material interface layer 58 can be deferred until later in the method 50 or can be patterned such that the layer of dielectric material 60 and/or buffer interface material layer 58 is removed only from PMOS device 14 regions of the wafer 10.

Next, in step 72, a mask 74 is formed over portions of the wafer 10 used to form the PMOS device 14. The mask 74 can be a photoresist or other appropriate material and can be patterned using appropriate techniques, such as photography.

Thereafter, in step 76, the source 26 and the drain 28 of the NMOS device 12 can be formed. Step 76 can include, for example, formation of extension regions 78, such as by using a lightly doped drain (LDD) technique, as is well known in the art. Briefly, for an NMOS device 12, N-type extensions regions can be formed by implanting ions such as antimony, phosphorous or arsenic. The ions used to form the extensions 78 may diffuse slightly under the gate 32 as is conventional. Sidewall spacers 80 can also be formed using a conventional technique and from a conventional material, such as a nitride. The spacers 80 and the gate 32 act as a self-aligned mask for implantation of deep doped regions 82. Implanting dopant species to form the deep doped regions 82 of the source 26 and the drain 28, respectively, is well known in the art and will not be described in great detail herein. Briefly, for the NMOS device 12, N-type deep doped regions 82 can be formed by implanting ions such as antimony, phosphorous or arsenic.

Figure 3C:
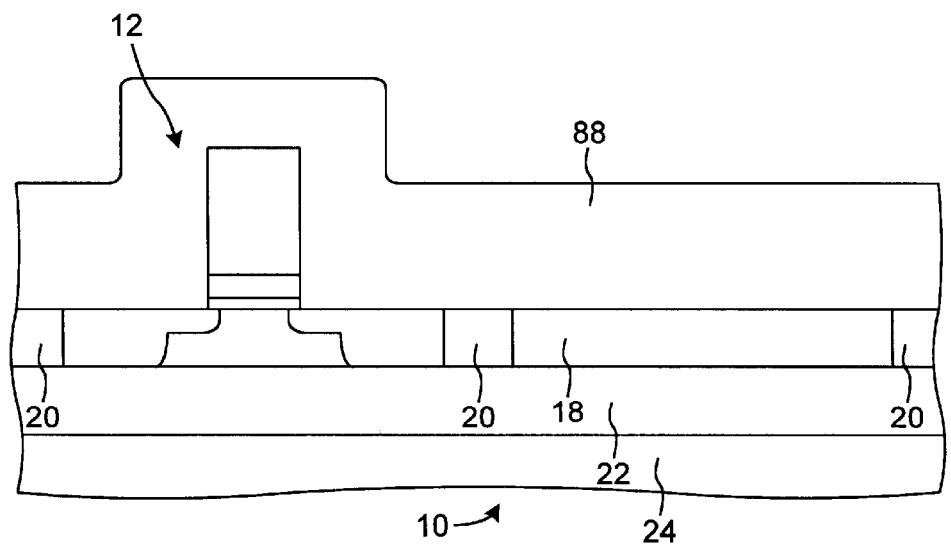

Next, in step 84 and with additional reference to FIG. 3C, the mask 74 can be removed using an appropriate technique, such as wet-chemical etching. If desired, and as shown in the illustrated embodiment, the spacers 80 can also be removed. Alternatively, the spacers 80 can be left in place or removed in subsequent processing steps.

Next, in step 86, an oxide film 88 can be deposited on the wafer 10. The oxide film 88 serves as a protective layer for the NMOS device 12 during formation of the PMOS device 14. Therefore, the oxide film 88 can alternatively be made from any another suitable material. The oxide film 88 is formed to encapsulate the NMOS device 12. Thereafter, in step 90, the oxide film 88 is removed from areas of the wafer 10 used to form the PMOS device 14 as best illustrated in FIG. 3D.

Figure 3D:
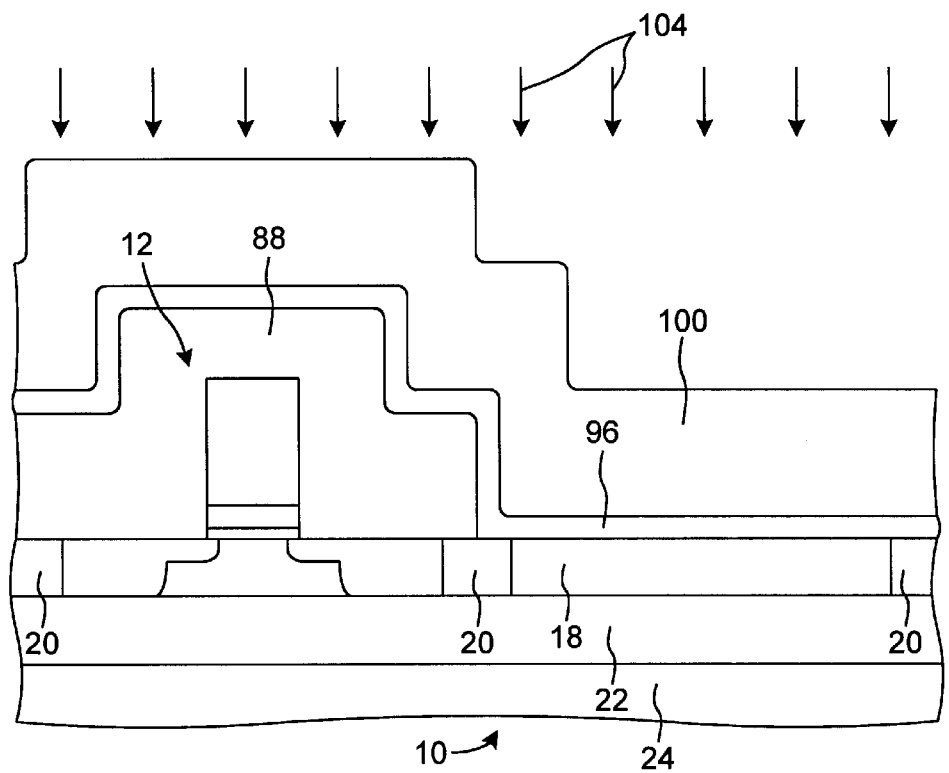

The method 50 continues in step 92, and with continued reference to FIGS. 2 and 3D, where the wafer 10 is subjected to a thermal cycle to active the dopant species implanted to form the source 26 and the drain 28 of the NMOS device 12. For example, the anneal cycle can be a rapid temperature anneal (RTA) where the wafer 10 is subjected to a temperature of about 800° C. to about 1,000° C.

Next, in step 94, a dielectric layer 96 used to form the gate dielectric 38 of the PMOS device 14 is deposited. As indicated above, the dielectric layer 96 can be made from a standard-K material, such as a nitride (e.g., silicon nitride) or an oxynitride (e.g., silicon oxynitride). Next, in step 98, a second layer of gate electrode material 100 used to form the gate electrode 36 of the PMOS device 14 is formed on the layer of dielectric material 96. The layer of material 100, in one embodiment, is a semiconductor material such as polycrystalline silicon or polycrystalline silicon-germanium. In an alternative embodiment, the layer of material 100 can be formed from a metal or metal-containing compound, such as tungsten, nickel, ruthenium, rhodiun, plalladium, platinum, titanium nitride, tantalum nitride, or the like.

Thereafter, in step 102, P+ ions 104 are implanted to appropriately dope the layer of material 100 for the formation of the gate electrode 36 of the PMOS device 14. For example, ions such as boron, gallium or indium can be implanted in step 102.

Figure 3E:
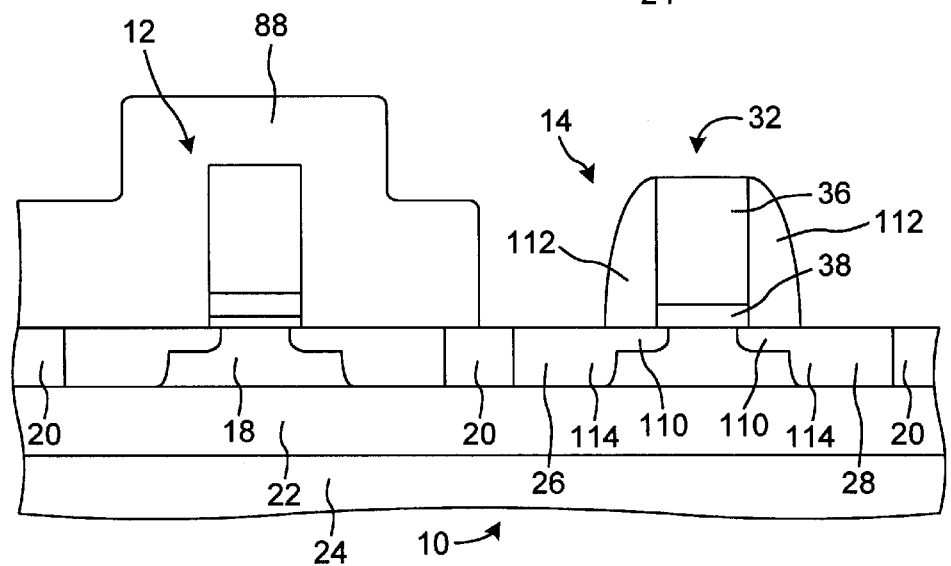

Next, in step 106 and with additional reference to FIG. 3E, the layer of material 100 is patterned to form the gate electrode 36 of the PMOS device 14. The dielectric layer 96 can also be patterned in step 106 or can be patterned in subsequent processing steps. Next, in step 108, the source 26 and the drain 28 of the PMOS device 14 are formed. Step 108 can include implantation of extensions 110. P-type extensions for the PMOS device 14 can be formed using a LDD technique as is well known in the art. Briefly, for P-type extension regions 110, ions such as boron, gallium or indium can be implanted. Step 108 can also include the formation of sidewall spacers 112 from a material such as a nitride, as is well known in the art. Thereafter, deep doped regions 114 can be formed by implanting an appropriate ion species such as boron, gallium or indium.

Thereafter, in step 116 and with additional reference to FIG. 1 the oxide layer 88 can be removed using an appropriate technique such as wet-chemical etching or dry reactive etching. In addition, the spacers 112 can optionally be removed as is illustrated in FIG. 1.

Next, in step 118 the wafer 10 is subjected to a thermal cycle to activate the dopant species implanted to form the source 26 and the drain 28 of the PMOS device 14. For example, an RTA cycle can be carried out at, for example, a temperature of about 800° C. to about 1,000° C.

Thereafter, in step 120, any additional processing used to complete formation of the NMOS device 12 and/or the PMOS device 14, and to interconnect various semiconductor devices formed on the wafer 10 (including the NMOS device 12 and the PMOS device 14) can be carried out.

The method 50 shows a specific order of steps for fabricating the NMOS device 12 and the PMOS device 12. However, it is understood that the order may differ from that depicted. For example, the order of two or more steps may be altered relative the order shown. Also, two or more steps may be carried out concurrently or with partial concurrence. In addition, various steps can be omitted and other steps may be added. Furthermore, the method 50 can be modified for the formation of devices other than MOSFET. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor wafer comprising:
   a layer of semiconductor material;
   an NMOS device, the NMOS device including:
      a first source, a first drain and a first body formed from the layer of semiconductor material, the first body disposed between the first source and the first drain; and
      a first gate formed over the first body and having a first gate electrode defining a first channel interposed between the first source and the first drain, the first gate electrode is disposed on a high-K gate dielectric layer that extends continuously from the first gate electrode to the layer of semiconductor material; and
   a PMOS device, the PMOS device including:
      a second source, a second drain and a second body formed from the layer of semiconductor material, the second body disposed between the second source and the second drain; and
      a second gate formed over the second body and having a second gate electrode defining a second channel interposed between the second source and the second drain, the second gate electrode separated from the layer of semiconductor material by a standard-K gate dielectric.

2. The semiconductor wafer according to claim 1, wherein the high-K gate dielectric has a relative permittivity of about twenty or higher.

3. The semiconductor wafer according to claim 1, wherein the high-K gate dielectric is composed of one or more materials selected from hafnium oxide, zirconium oxide, cerium oxide, aluminum oxide, titanium oxide, yttrium oxide, barium strontium titanate and mixtures thereof.

4. The semiconductor wafer according to claim 1, wherein the standard-K gate dielectric is composed of one or more materials selected from a nitride or an oxynitride.

5. The semiconductor wafer according to claim 1, wherein the layer of semiconductor material is a semiconductor film disposed on an insulating layer, the insulating layer being disposed on a semiconductor substrate.

6. The semiconductor wafer according to claim 1, wherein the PMOS device is formed with a lower thermal budget than the NMOS device.

7. A method of forming an NMOS device and a PMOS device on a semiconductor wafer, comprising:

providing a layer of semiconductor material;

forming the NMOS device, including:
   forming a layer of high-K dielectric material over the layer of semiconductor material;
   forming a first gate electrode for the NMOS device; and
   forming a first source and a first drain for the NMOS device from the layer of semiconductor material such that the first gate electrode defines a first channel interposed between the first source and the first drain; and forming the PMOS device following NMOS device formation, including:
   encapsulating the NMOS device with a protective layer;
   forming a layer of standard-K dielectric material over the layer of semiconductor material;
   forming a second gate electrode for the PMOS device; and
   forming a second source and a second drain for the PMOS device from the layer of semiconductor material such that the second gate electrode defines a second channel interposed between the second source and the second drain.

8. The method according to claim 7, wherein the high-K dielectric layer has a relative permittivity of about twenty or higher.

9. The method according to claim 7, wherein the high-K dielectric layer is composed of one or more materials selected from hafnium oxide, zirconium oxide, cerium oxide, aluminum oxide, titanium oxide, yttrium oxide, barium strontium titanate and mixtures thereof.

10. The method according to claim 7, wherein the standard-K dielectric layer is composed of one or more materials selected from a nitride or an oxynitride.

11. The method according to claim 7, wherein formation of the NMOS device further includes forming a buffer interface layer between the high-K dielectric layer and the layer of semiconductor material.

12. The method according to claim 11, wherein the buffer interface layer is formed from an oxide having a thickness of about 0.5 nm to about 0.7 nm.

13. The method according to claim 7, wherein the layer of semiconductor material is a semiconductor film disposed on an insulating layer, the insulating layer being disposed on a semiconductor substrate.

14. The method according to claim 7, wherein the step of forming the first gate electrode for the NMOS device includes depositing a first layer of gate electrode semiconductor material, doping the first layer of gate electrode semiconductor material and patterning the first layer of gate electrode semiconductor material, and the step of forming the second gate electrode for the PMOS device includes depositing a second layer of gate electrode semiconductor material, doping the second layer of gate electrode semiconductor material and patterning the second layer of gate electrode semiconductor material.

15. The method according to claim 7, wherein the step of forming the first source and the first drain includes a first thermal cycle and the step of forming the second source and the second drain includes a second thermal cycle.

16. A semiconductor wafer comprising:

a layer of semiconductor material;

an NMOS device, the NMOS device including:
   a first source, a first drain and a first body formed from the layer of semiconductor material, the first body disposed between the first source and the first drain; and
   a first gate formed over the first body and having a first gate electrode defining a first channel interposed between the first source and the first drain, the first gate electrode separated from the layer of semiconductor material by a high-K gate dielectric, wherein the high-K gate dielectric is disposed on a silicon oxide buffer interface layer and the buffer interface layer is in contact with the layer of semiconductor material; and a PMOS device, the PMOS device including:
   a second source, a second drain and a second body formed from the layer of semiconductor material, the second body disposed between the second source and the second drain; and
   a second gate formed over the second body and having a second gate electrode defining a second channel interposed between the second source and the second drain, the second gate electrode separated from the layer of semiconductor material by a standard-K gate dielectric.

17. The semiconductor wafer according to claim 16, wherein the high-K gate dielectric has a relative permittivity of about twenty or higher.

18. The semiconductor wafer according to claim 16, wherein the high-K gate dielectric is composed of one or more materials selected from hafnium oxide, zirconium oxide, cerium oxide, aluminum oxide, titanium oxide, yttrium oxide, barium strontium titanate and mixtures thereof.

19. The semiconductor wafer according to claim 16, wherein the standard-K gate dielectric is composed of one or more materials selected from a nitride or an oxynitride.

20. The semiconductor wafer according to claim 16, wherein the buffer interface layer has a thickness of about 0.5 nm to about 0.7 nm.

21. The semiconductor wafer according to claim 16, wherein the layer of semiconductor material is a semiconductor film disposed on an insulating layer, the insulating layer being disposed on a semiconductor substrate.

22. The semiconductor wafer according to claim 16, wherein the PMOS device is formed with a lower thermal budget than the NMOS device.

23. A semiconductor wafer comprising:

a layer of semiconductor material;

an NMOS device, the NMOS device including:
   a first source, a first drain and a first body formed from the layer of semiconductor material, the first body disposed between the first source and the first drain; and
   a first gate formed over the first body and having a first gate electrode defining a first channel interposed between the first source and the first drain, the first gate electrode separated from the layer of semiconductor material by a high-K gate dielectric; and a PMOS device, the PMOS device including:
   a second source, a second drain and a second body formed from the layer of semiconductor material, the second body disposed between the second source and the second drain; and a second gate formed over the second body and having a second gate electrode defining a second channel interposed between the second source and the second drain, wherein the second gate electrode is disposed on a standard-K gate dielectric layer that extends from the second gate electrode to the layer of semiconductor material and is made from a substantially uniform layer composed of a material selected from the group consisting of silicon oxide, silicon nitride and silicon oxynitride.

24. The semiconductor wafer according to claim 23, wherein the high-K gate dielectric has a relative permittivity of about twenty or higher.

25. The semiconductor wafer according to claim 23, wherein the high-K gate dielectric is composed of one or more materials selected from hafnium oxide, zirconium oxide, cerium oxide, aluminum oxide, titanium oxide, yttrium oxide, barium strontium titanate and mixtures thereof.

26. The semiconductor wafer according to claim 23, the standard-K gate dielectric is made from silicon nitride.

27. The semiconductor wafer according to claim 23, wherein the standard-K gate dielectric is made form silicon oxynitride.

28. The semiconductor wafer according to claim 23, further comprising a buffer interface disposed between the high-K gate dielectric and the layer of semiconductor material.

29. The semiconductor wafer according to claim 28, wherein the buffer interface is formed from an oxide having a thickness of about 0.5 nm to about 0.7 nm.

30. The semiconductor wafer according to claim 23, wherein the layer of semiconductor material is a semiconductor film disposed on an insulating layer, the insulating layer being disposed on a semiconductor substrate.

31. The semiconductor wafer according to claim 23, wherein the PMOS device is formed with a lower thermal budget than the NMOS device.

* * * * *